(12) United States Patent
Ito

(10) Patent No.: US 11,476,141 B2
(45) Date of Patent: Oct. 18, 2022

(54) RAIL-GUIDED TROLLEY SYSTEM, AND RAIL-GUIDED TROLLEY

(71) Applicant: MURATA MACHINERY, LTD., Kyoto (JP)

(72) Inventor: Yasuhisa Ito, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 906 days.

(21) Appl. No.: 16/326,381

(22) PCT Filed: Jul. 14, 2017

(86) PCT No.: PCT/JP2017/025739
§ 371 (c)(1),
(2) Date: Feb. 19, 2019

(87) PCT Pub. No.: WO2018/037762
PCT Pub. Date: Mar. 1, 2018

(65) Prior Publication Data
US 2019/0189488 A1 Jun. 20, 2019

(30) Foreign Application Priority Data
Aug. 26, 2016 (JP) .............................. JP2016-165607

(51) Int. Cl.
*B61B 3/02* (2006.01)
*B65G 1/04* (2006.01)
(Continued)

(52) U.S. Cl.
CPC .......... *H01L 21/67724* (2013.01); *B61B 3/02* (2013.01); *B65G 1/04* (2013.01);
(Continued)

(58) Field of Classification Search
CPC ........... H01L 21/67724; H01L 21/6773; H01L 21/67733; B61B 3/02; B65G 1/04;
(Continued)

(56) References Cited

U.S. PATENT DOCUMENTS 8,826,825 B2 * 9/2014 Shibata ...................... B61B 3/02
191/22 R
2003/0229416 A1 12/2003 Tai et al.
(Continued)

FOREIGN PATENT DOCUMENTS

CN 102826384 A 12/2012
CN 103159023 A 6/2013
(Continued)

OTHER PUBLICATIONS

Official Communication issued in European Patent Application No. 17843249.8, dated Mar. 17, 2020.
(Continued)

*Primary Examiner* — Gregory W Adams
(74) *Attorney, Agent, or Firm* — Keating & Bennett, LLP

(57) ABSTRACT

A rail-guided trolley system includes a main body that, along rails at least partially in a grid pattern, holds and transports a transportation container on a lower side of the rails, traveling wheels at each of four corners of the main body and that travel on the rails, a controller that controls pivot drivers that change orientations of the traveling wheels, and auxiliary wheels each located at least in either front or rear in a traveling direction of the traveling wheel.

8 Claims, 10 Drawing Sheets

(51) Int. Cl.
*H01L 21/677* (2006.01)
*B65G 47/90* (2006.01)
*B65G 1/00* (2006.01)

(52) U.S. Cl.
CPC ........... *B65G 1/0457* (2013.01); *B65G 47/90* (2013.01); *H01L 21/6773* (2013.01); *H01L 21/67733* (2013.01); *B65G 1/00* (2013.01)

(58) Field of Classification Search
CPC ........ B65G 1/0457; B65G 47/90; B65G 1/00; B66C 7/04; B66C 7/12; B66C 7/02
See application file for complete search history.

(56) References Cited

U.S. PATENT DOCUMENTS

| | | |
|---|---|---|
| 2012/0275886 A1 | 11/2012 | Ota |
| 2014/0069291 A1 | 3/2014 | Yang et al. |
| 2019/0019707 A1 | 1/2019 | Suzuki |

FOREIGN PATENT DOCUMENTS

| | | | |
|---|---|---|---|
| CN | 104828507 A | | 8/2015 |
| JP | 10119764 A | * | 5/1998 |
| JP | 2016-041532 A | | 3/2016 |
| KR | 10-1436905 B1 | | 11/2014 |
| WO | 2015/005873 A1 | | 1/2015 |
| WO | 2016/029205 A1 | | 2/2016 |

OTHER PUBLICATIONS

Official Communication issued in International Patent Application No. PCT/JP2017/025739, dated Oct. 3, 2017.

* cited by examiner

RAIL-GUIDED TROLLEY SYSTEM, AND RAIL-GUIDED TROLLEY

BACKGROUND OF THE INVENTION

1. Field of the Invention

The present invention relates to a rail-guided trolley system, and a rail-guided trolley.

2. Description of the Related Art

In manufacturing factories such as semiconductor manufacturing factories, for example, articles such as transportation containers (FOUPs, reticle pods) for containing semiconductor wafers or reticles are transported by a rail-guided trolley. As a system that includes this rail-guided trolley, there is known a system in which a trolley that holds an article travels along rails installed on a ceiling (for example, see Japanese Unexamined Patent Application, First Publication No. 2012-111635), and in order to diversify traveling paths for a trolley, there has been proposed a configuration in which rails are arranged in a grid pattern to allow a trolley to travel in horizontal and vertical directions (for example, see Japanese Patent Application No. 2016-041532).

In the above rail-guided trolley system, a container for storing an article on a trolley is arranged above the rails together with a main body of the trolley. Therefore, when loading or unloading an article from or to a predetermined position below the rails, it is necessary to raise or lower the article using a location where there is no rail, or a space between the rails, and as a result, the position for loading or unloading the article is limited. Therefore, there has also been proposed a system in which an article is held on the lower side of rails and traveling of a trolley is made possible in this state.

In the system in which an article is held on the lower side of the rails, while traveling wheels are on the rails, the article container or the main body of the trolley are arranged on the lower side of the rails. Therefore, a coupler that couples the traveling wheels and the container (or the main body) straddles the upper and lower sides of the rails. For this reason, in the rails in a grid pattern as described above, gaps (slits) are required for allowing the coupler to pass through intersecting portions. If there is a gap in a part of a rail as described above, there is a possibility that the traveling wheel may fall into the gap while the trolley is traveling and this may result in vibration being given to the article. Moreover, when changing the orientation of the traveling wheel at an intersecting portion of the rail, there is a possibility that not only may vibration be applied to the article but the orientation of the traveling wheel may also not be changed easily, as a result of the traveling wheel being caught on the gap.

SUMMARY OF THE INVENTION

In view of the above circumstances, preferred embodiments of the present invention provide rail-guided trolley systems and rail-guided trolleys each capable of preventing a traveling wheel from falling into a rail gap, preventing vibration being applied to an article, and easily changing the orientation of the traveling wheel.

A rail-guided trolley system according to a preferred embodiment of the present invention includes a main body that, along rails including a portion thereof arranged in a grid pattern, holds and transports an article on a lower side of the rail, the rail-guided trolley system including: a traveling wheel that is provided at each of four corners of the main body and that travels on the rail, a controller that controls a pivot driver that changes the orientation of the traveling wheel, and an auxiliary wheel that is located at least in either front or rear in a traveling direction of the traveling wheel.

The main body may be of a size that fits within a cell of the grid-patterned rail in a plan view. At least one of the four traveling wheels may be a driving wheel. Among the four traveling wheels, two of the four traveling wheels arranged in diagonally opposed positions in the main body may be drive wheels. The auxiliary wheel may be arranged such that a contact height with respect to the rail is higher than a contact height of the traveling wheel with respect to the rail. The auxiliary wheel may be provided on an inner side of the traveling wheel. The auxiliary wheel may be larger in diameter than the traveling wheel. The auxiliary wheel may have a smaller friction coefficient with respect to the rail than that of the traveling wheel.

A rail-guided trolley according to a preferred embodiment of the present invention includes a main body that, along a rail including a portion thereof arranged in a grid pattern, holds and transports an article on a lower side of the rails, the rail-guided trolley including a traveling wheel that is provided at each of four corners of the main body and that travels on the rails; a pivot driver that changes the orientation of the traveling wheel; and an auxiliary wheel that is located at least in either front or rear in a traveling direction of the traveling wheel.

According to a rail-guided trolley system according to a preferred embodiment of the present invention, since the auxiliary wheel is located at least in either front or rear of the traveling wheel, when the main body is traveling or when changing the orientation of the traveling wheel, the auxiliary wheel comes in contact with the rail, thus preventing the traveling wheel from falling into a rail gap. As a result, it is possible to prevent vibration or an impact from being applied to an article, and prevent damage to the article. Moreover, when changing the orientation of the traveling wheel, the traveling wheel is prevented from being caught on the gap, and as a result, the orientation of the traveling wheel is able to be changed easily.

In a rail-guided trolley system in which the main body is of a size that fits within a cell of the grid pattern of the rails in a plan view, it is possible to ensure a space for passing by another rail-guided trolley traveling on an adjacent rail. As a result, high-density transportation using a large number of trolleys becomes possible. Furthermore, in the rail-guided trolley system in which at least one of the four traveling wheels is a driving wheel, the main body is able to be driven efficiently. In the rail-guided trolley system in which two of the four traveling wheels arranged in diagonally opposed positions in the main body are drive wheels, even in the case where one of the driving wheels is positioned at a rail gap, since the other driving wheel is in contact with the rail, reliable traveling is possible.

In a rail-guided trolley system in which the auxiliary wheel has a higher contact height with respect to the rails than that of the traveling wheel, the auxiliary wheel does not come in contact with the rails except when the traveling wheel is positioned at the rail gap, and as a result, unnecessary contact with the rail is prevented and generation of particles is able to be reduced or prevented. In the rail-guided trolley system in which the auxiliary wheel is located on the inner side of the traveling wheel, it is possible to make the rotation radius for pivoting the traveling wheel and the auxiliary wheel small and make the space required for changing the traveling direction small. In a rail-guided trolley system in which the auxiliary wheel is smaller in diameter than the traveling wheel, the auxiliary wheel in either front or rear of the traveling wheel is small, and it is therefore possible to make the rotation radius for rotating the traveling wheel and the auxiliary wheels small and make the space required for changing the traveling direction small. In the rail-guided trolley system in which the auxiliary wheel has a smaller friction coefficient with respect to the rails than that of the traveling wheel, the auxiliary wheel slides on the rails, and thus, the traveling wheel and the auxiliary wheel smoothly rotate.

A rail-guided trolley according to a preferred embodiment of the present invention can be applied to the above rail-guided trolley system, and when the main body is traveling or when changing the orientation of the traveling wheel, the traveling wheel is prevented from falling into a gap in the rail to prevent vibration from being applied to an article, and further, the orientation of the traveling wheel is able to be easily changed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
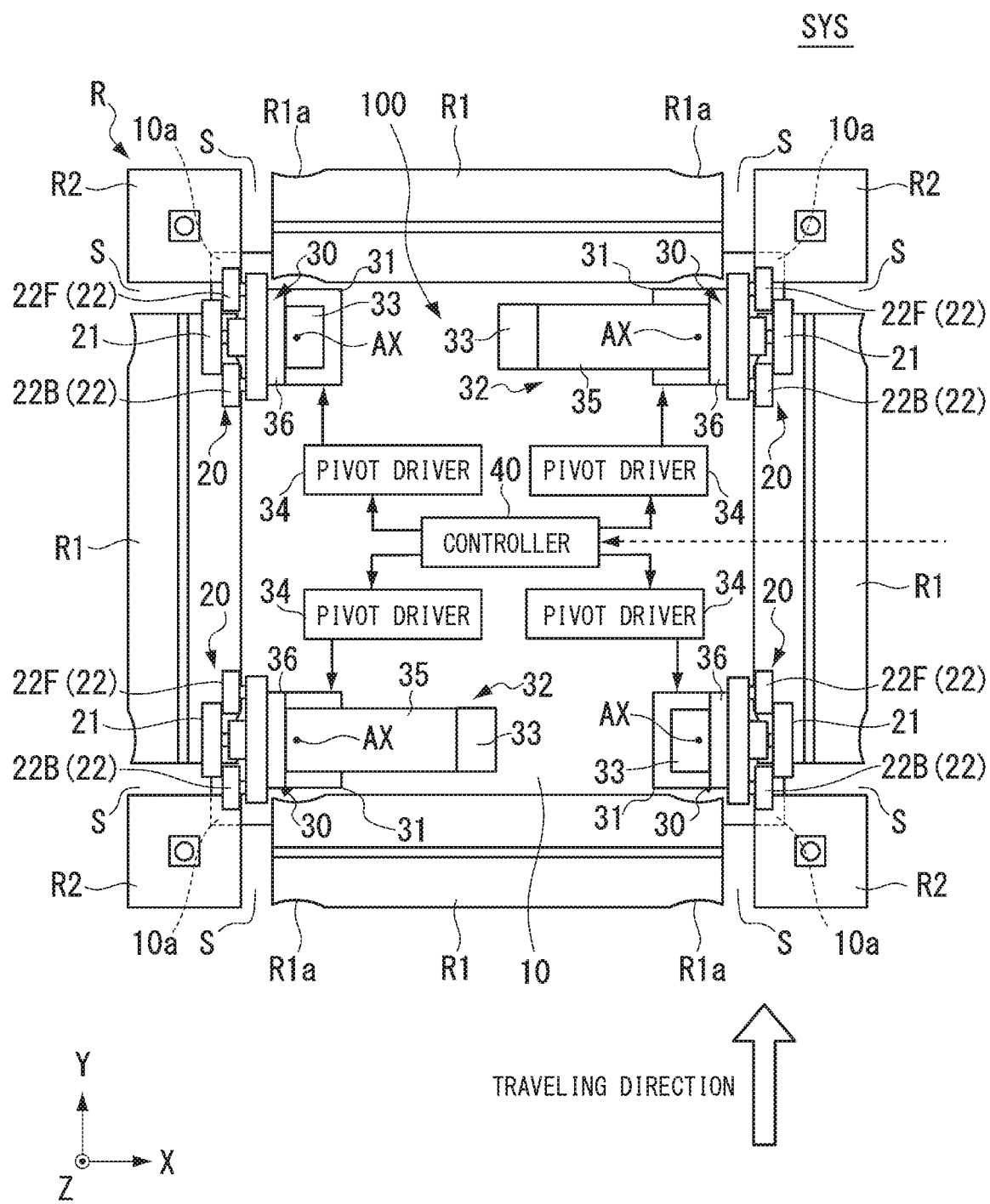
FIG. 1 is a plan view showing an example of a rail-guided trolley system and a rail-guided trolley according to a preferred embodiment of the present invention.

The following describes preferred embodiments of the present invention with reference to the drawings. However, the present invention is not limited to the preferred embodiments. Note that, in the drawings, scale is changed as necessary to illustrate the preferred embodiments, such as by enlarging or by emphasizing an element or structure. In the following drawings, an XYZ coordinate system is used to describe the directions in each drawing. In the XYZ coordinate system, a plane that is parallel to a horizontal plane is defined as an XY plane. In this XY plane, one linear direction which is a traveling direction of the rail-guided trolley 100 is denoted as a Y direction for convenience and a direction orthogonal to the Y direction is denoted as an X direction. A direction perpendicular to the XY plane is denoted as a Z direction. For each of the X direction, the Y direction, and the Z direction, description is made with a definition in which a direction indicated by an arrow is the positive (+) direction and a direction opposite to the direction indicated by the arrow is the negative (−) direction. Also, a rotation direction about the Z direction is denoted as a θZ direction.

The rail-guided trolley 100 may also travel in the X direction in some cases in addition to traveling in the Y direction. The rail-guided trolley 100 may also travel in a curved direction, for example, in addition to the linear direction as shown in the figure.

Figure 2:
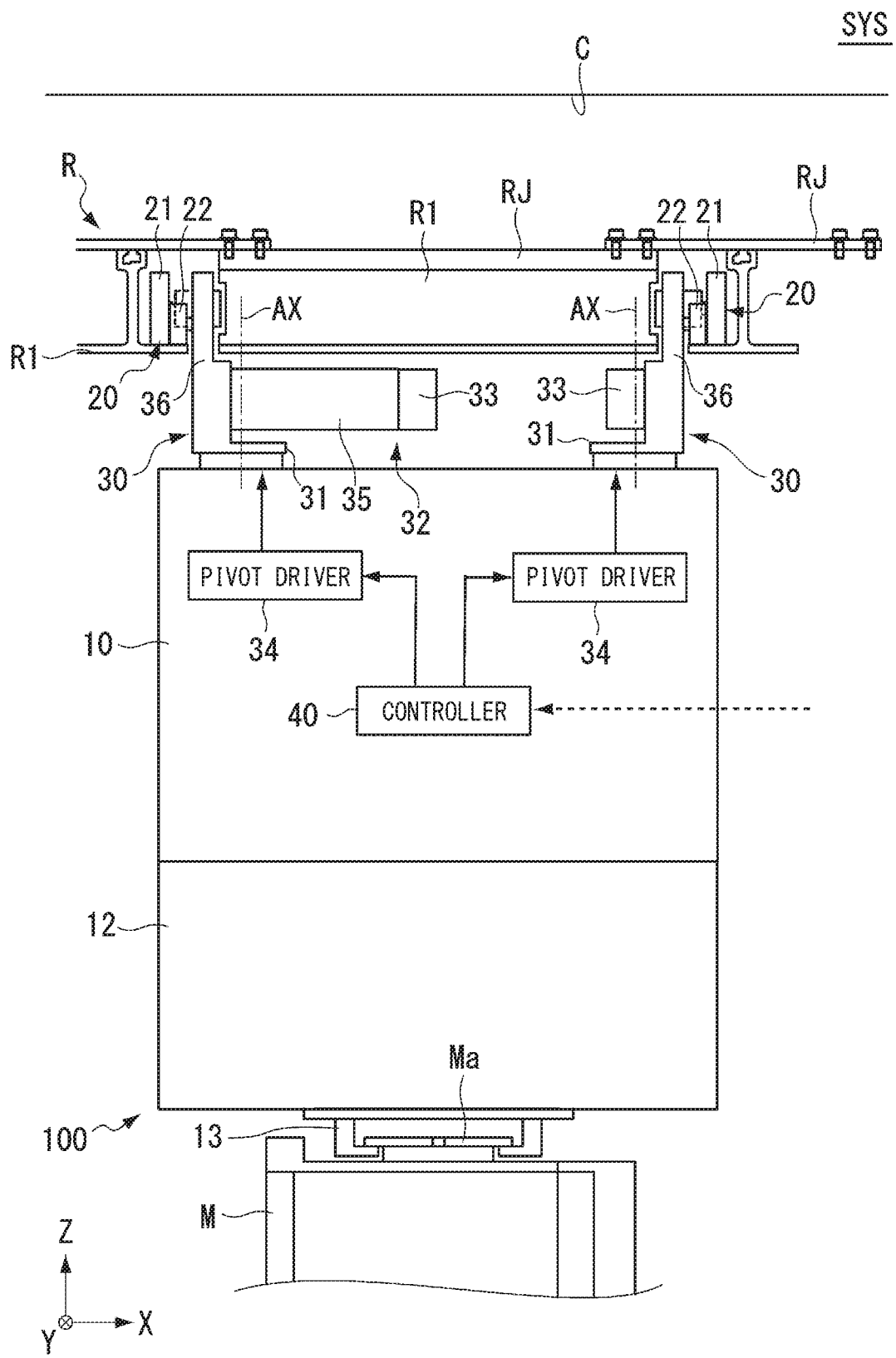
FIG. 2 is a front elevation view of the rail-guided trolley system and the rail-guided trolley shown in FIG. 1.
Figure 3:
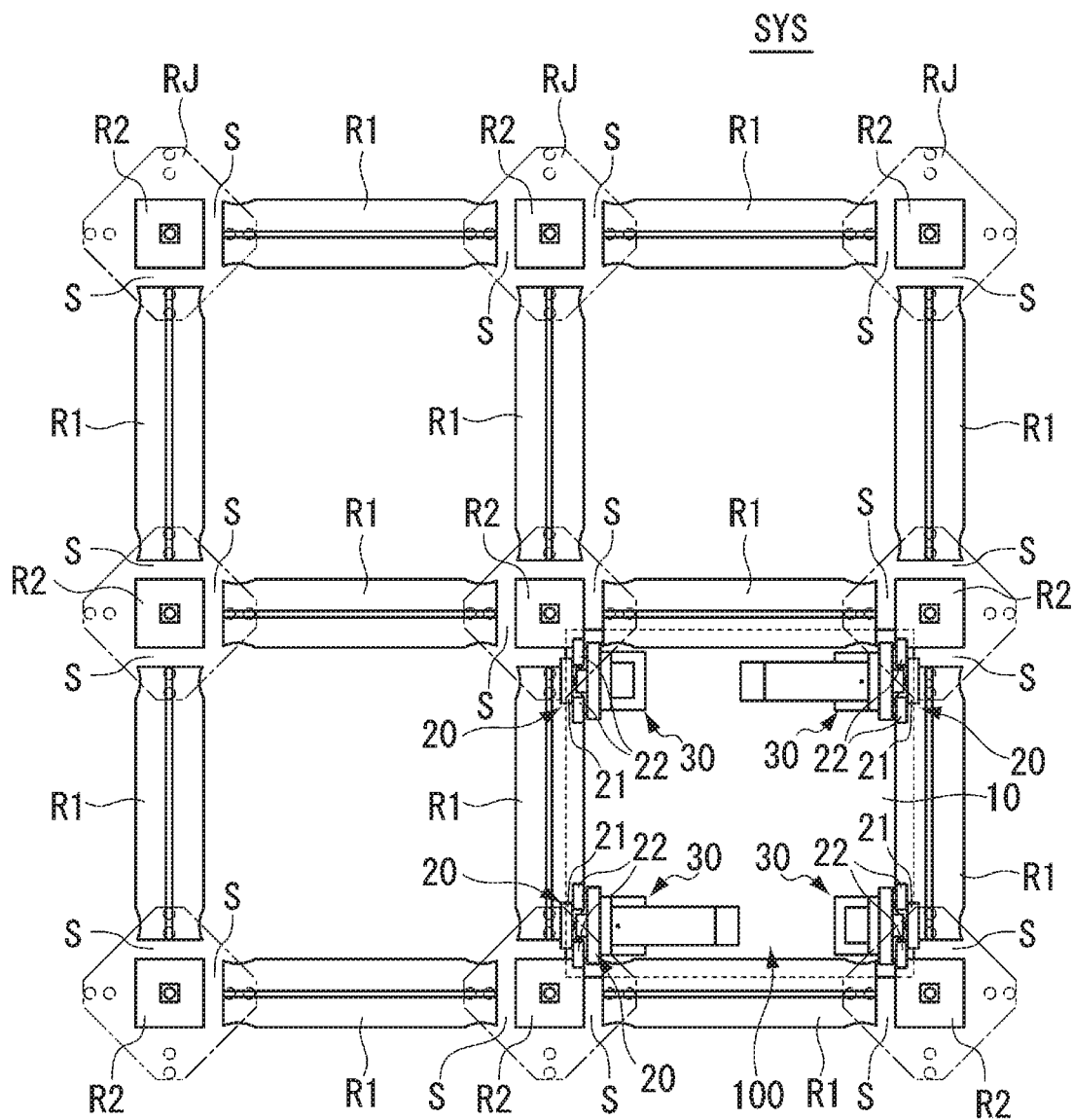
FIG. 3 is a plan view showing a state of a range of installed rails having been expanded.

FIG. 1 is a plan view showing an example of a rail-guided trolley system SYS and the rail-guided trolley 100 according to a preferred embodiment of the present invention. FIG. 2 is a front elevation view of the rail-guided trolley system SYS and the rail-guided trolley 100 shown in FIG. 1. FIG. 3 is a plan view showing a state of a range of installed rails R having been expanded in the rail-guided trolley system SYS. The rail-guided trolley system SYS shown in FIG. 1 to FIG. 3 is, for example, a system for transporting a transport container M such as a FOUP for accommodating semiconductor wafers or a reticle Pod for accommodating reticles as an article in a clean room of a semiconductor manufacturing factory. As shown in FIG. 1, the rail-guided trolley system SYS includes rails R and a rail-guided trolley 100.

The rails R are installed in the vicinity of a ceiling of a building such as a clean room. As shown in FIG. 2, the rails R are fixed in a state of being suspended from a ceiling C by a fixture not shown in the figure. As shown in FIG. 1, the rail R has linear portions R1 and corner portions R2. The linear portions R1 and the corner portions R2 are arranged alternately at predetermined intervals in the X direction and the Y direction. As a result, the rails R are arranged in a grid pattern as shown in FIG. 3. At an intersecting portion of the rails R, the linear portions R1 are arranged on each of the +X side, the −X side, the +Y side, and the −Y side of one corner portion R2, and such arrangement is repeated several times in the X direction and the Y direction. The linear portion R1 and the corner portion R2 are coupled to each other on the upper side of the rail R by a coupler such as a rail joint RJ (see FIG. 2 and FIG. 3).

A gap is provided between the linear portion R1 and the corner portion R2. The gap S is a portion through which a coupler 30 passes when the rail-guided trolley 100 travels. On an end portion in a longitudinal direction of the linear portion R1 there is provided a curved portion R1a. The curved portion R1a is provided to avoid interference between the rail R (linear portion R1) and the coupler 30 when the coupler 30 described later rotates in the θZ direction, in the case where the rail-guided trolley 100 changes the traveling direction thereof. Therefore, the curved portion R1a is structured according to the size of the coupler 30, and it need not be provided if the coupler 30 is small.

The rail-guided trolley 100 includes a main body 10, a traveler 20, a coupler 30, and a controller 40. The rail-guided trolley 100 travels along the rails R and transports a transport container M. In the rail-guided trolley system SYS, the number of the rail-guided trolleys 100 is not limited to one, and a plurality of rail-guided trolleys 100 may be used. The plurality of rail-guided trolleys 100 each transporting the transportation container M enable high density transportation.

The main body 10 is located on the lower side (the −Z side) of the rails R (see FIG. 2). As shown in FIG. 1, the main body 10 preferably has a rectangular shape having four corners 10a when viewed in a plan view. Further, the main body 10 preferably has a size that fits within a cell of a grid pattern of rails R in a plan view. Therefore, it is possible to pass by another rail-guided trolley 100 traveling on the adjacent rail R, and in the case where a plurality of rail-guided trolleys 100 are deployed on the rails R, it is possible to expand the range in which each rail-guided trolley 100 can travel without interfering with other rail-guided trolleys.

As shown in FIG. 2, the main body 10 includes a transferor 12. The transferor 12 holds the transportation container M and is able to transfer the transportation container M to a predetermined loading place below the rails R. The transferor 12 includes a gripper 13 to grip a flange Ma of the transportation container M, and holds the transportation container M in a suspending manner. The gripper 13 is connected to suspenders such as a plurality of belts or ropes. The transferor 12 raises or lowers the gripper 13 by feeding out or winding up these suspenders by a hoist (not shown in the figure) or the like, and delivers or receives the transportation container M to or from a rack 15 or a carrying-in/out port of a storage 14 below the rails R, or a carrying-in/out port of a processing apparatus or the like.

Figure 4:
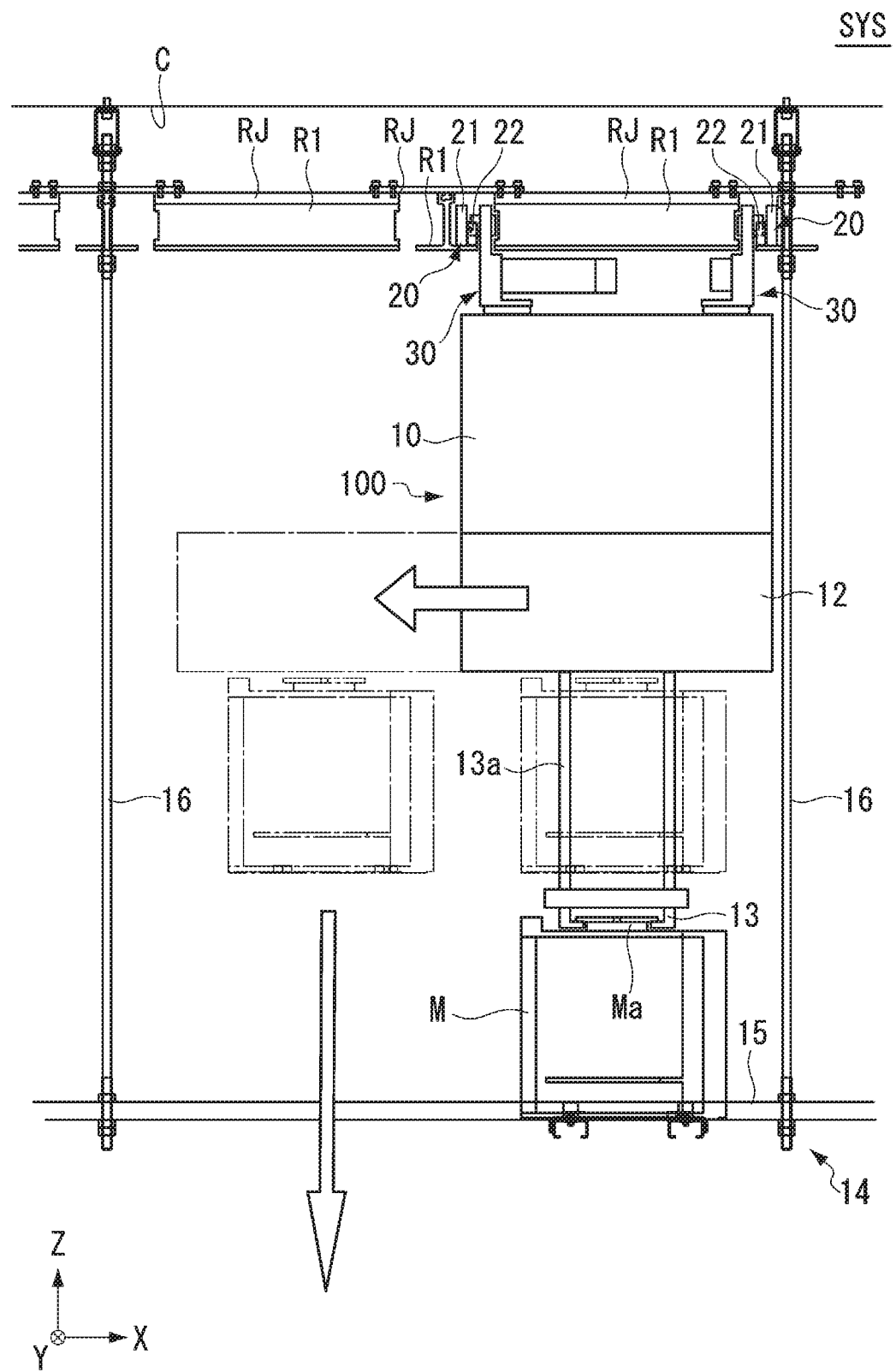
FIG. 4 is a front elevation view showing an example of delivery and receipt of an article.

FIG. 4 is a front elevation view showing an example of delivery and receipt of the transportation container M performed by the rail-guided trolley 100. As shown in FIG. 4, the transportation container M is delivered or received between the rail-guided trolley 100 and the rack 15 of the storage 14. The storage 14 is located below the traveling path of the rail-guided trolley 100 and includes the rack 15 and a suspending rod 16. The rack 15 is suspended from the ceiling C by the suspending rod 16. A plurality of pins not shown in the figure are provided on the rack 15 in a projecting manner, and when the transportation container M is placed on the rack 15, the plurality of pins enter grooves provided in a bottom surface of the transportation container M to position the transportation container M.

The storage 14 is a storage device in which the transportation container M is temporarily placed and is in a state of being suspended below the traveling path of the rail-guided trolley 100. The storage 14 is not limited to the structure shown in the figure, and may, for example, be a storage device installed on the floor and including a plurality of placement racks arranged vertically, or a storage device installed in the vicinity of a processing apparatus that temporarily stores the transportation container M.

As shown in FIG. 4, the transferor 12 may include a lateral extender to move the transportation container M in a horizontal direction (X direction or Y direction). By driving the lateral extender, the transferor 12 projects in the horizontal direction from the main body 10. As a result, even if a transfer location of the transportation container M deviates from the lower side of the main body 10, the transferor 12 can be positioned above the transfer location by the lateral extender, and by raising or lowering the transportation container M after the transferor 12 has been extended laterally, it is possible to deliver or receive the transportation container M to or from the transfer location that deviates from the lower side of the main body 10. The transferor 12 may include a rotator that rotates the held transportation container M about an axis in a vertical direction.

As shown in FIG. 1, each traveler 20 includes a traveling wheel 21 and auxiliary wheels 22. The traveling wheel 21 is provided in each of the corners 10a of the main body 10. The traveling wheel 21 comes in contact with the rails R including the linear portions R1 and the corner portions R2. The outer diameter of the traveling wheel 21 is preferably larger than the length of the gap S. The traveling wheel 21 is rotatably supported on a coupler 30 described later. Anti-slip processing such as affixing rubber or the like may be performed on the circumferential surface of the traveling wheel 21 that comes in contact with the rails R.

The auxiliary wheels 22 are each located in front and rear in the traveling direction of the traveling wheel 21. Hereinafter, when the front and rear auxiliary wheels 22 are distinguished from each other in the description, the auxiliary wheel 22 located on the front side of the traveling wheel 21 is referred to as front side auxiliary wheel 22F, and the auxiliary wheel 22 located on the rear side of the traveling wheel 21 is referred to as rear side auxiliary wheel 22B. As with the traveling wheel 21, the two auxiliary wheels 22 are each rotatably supported on a coupler 30 described later. Although the rotational axes of the two auxiliary wheels 22 are preferably parallel to each other, the present invention is not limited thereto, and the auxiliary axes need not be parallel to each other.

Since the two auxiliary wheels 22 are located in front and rear in the traveling direction of the traveling wheel 21, the traveling wheel 21 and the two auxiliary wheels 22 are aligned in the traveling direction (Y direction). The two auxiliary wheels 22 are both located on the inner side of the traveling wheel 21. This arrangement makes the rotation radius for pivoting the traveling wheel 21 and the auxiliary wheels 22 small and makes the space required for changing the traveling direction small. The configuration for pivoting the traveling wheel 21 and the auxiliary wheels 22 will be described later. Further, processing of reducing friction may be applied to the circumferential surface of the auxiliary wheel 22 that comes in contact with the rail R. As a result, the friction coefficient of the auxiliary wheel 22 with respect to the rails R becomes smaller than that of the traveling wheel 21. The distance between the auxiliary wheel 22 and the traveling wheel 21 is preferably greater than the length of the gap S.

The auxiliary wheel 22 has a smaller diameter than that of the traveling wheel 21. Therefore, it is possible to reduce the total length of the traveler 20. It is also possible to make the rotation radius for pivoting the traveling wheel 21 and the auxiliary wheels 22 small. Although the front side auxiliary wheel 22F and the rear side auxiliary wheel 22B preferably have the same diameter, the present invention is not limited to this, and different diameters may be used.

The coupler 30 includes a coupling member 31, a traveling driver 32, a position detector 33, and a pivot driver 34. The coupling member 31 is provided in each of the four corners 10a of the main body 10. The coupling member 31 couples the main body 10 and the traveling wheel 21 (auxiliary wheels 22). The coupling member 31 is provided so as to be able to pivot in a θZ direction about a pivot axis AX. As the coupling member 31 pivots, the traveling wheel 21 and the auxiliary wheels 22 can pivot in the θZ direction and can change the traveling direction thereof.

The traveling driver 32 is attached to the coupling member 31. The traveling driver 32 drives the traveling wheel 21. The traveling driver 32 is mounted on each of the coupling members 31 arranged at two diagonally opposed corners 10a among the four corners 10a. Therefore, among the four traveling wheels 21, the two traveling wheels 21 that are each driven by the traveling driver 32 serve as the driving wheels. As a result of arranging the driving wheels in diagonally opposed positions, even when one of them is positioned on a gap S, the other is still positioned on a rail R, and therefore, the driving force is able to be continuously generated.

The traveling driver 32 includes a drive source 35 such as an electric motor and a transmission 36 to be described later. An output axis (not shown in the figure) of the drive source 35 is connected to an axis 21a (see FIGS. 5A-5C) of the traveling wheel 21 via the transmission 36. The drive source 35 is fixed to a main body coupler 31c. Therefore, the drive source 35 integrally pivots in the θZ direction as the coupling member 31 pivots. Note that the drive source 35 is arranged so as to fit within the outer shape of the main body 10 in a plan view. As a result, even when the drive source 35 pivots, it is possible to prevent the drive source 35 from protruding outward from the main body 10. Since the two drive sources 35 are arranged symmetric about the center point of the main body 10 in a plan view, the drive source 35 having a relatively large weight is able to be arranged in the main body 10 in a well-balanced manner. Further, by driving the drive source 35 in forward and reverse directions, the rail-guided trolley 100 can move not only in the +Y direction but also in the −Y direction.

The position detector 33 is mounted on the coupling member 31. The position detector 33 is connected to the traveling wheel 21 via the transmission 36 and is able to detect a position of the rail-guided trolley 100 by detecting a rotation amount or the like of the traveling wheel 21. The position detector 33 is mounted on the two coupling members 31 with no traveling driver 32 provided thereon, among the four coupling members 31. The position detector 33 detects a traveling distance (a position of the rail-guided trolley 100) of the traveling wheel 21 based on a rotation amount of the axis 21a (see FIGS. 5A-5C) of the traveling wheel 21, for example. As the position detector 33, for example, a rotary encoder or the like is preferably used. The position detector 33 is also provided at an end portion of the drive source 35. The position detector 33 provided on the drive source 35 detects a rotation position or the like of the output axis of the drive source 35 or that of the traveling wheel 21. As the position detector 33, for example, a rotary encoder or the like is used.

The detection result of the position detector 33 is sent to, for example, the controller 40 and so forth. The controller 40 complements the detection results from the two position detectors 33 with each other, and as a result, even when one traveling wheel 21 is positioned on the gap S and does not rotate, the position of the rail-guided trolley 100 is able to be accurately detected, using the detection result from the position detector 33 of the other traveling wheel 21.

The pivot driver 34 is provided in the main body 10 for each coupling member 31. The pivot driver 34 has a drive source (not shown in the figure) such as an electric motor and causes the coupling member 31 to pivot about the pivot axis AX. The pivot driver 34 is controlled by the controller 40. Note that the pivot driver 34 is not limited to being provided for each coupling member 31, and a single pivot driver 34 may drive a plurality of coupling members 31 to pivot.

The controller 40 is configured or programmed to comprehensively control operations of the respective elements such as the traveling driver 32 and the pivot driver 34. The controller 40 is provided, for example, in the main body 10. However, the controller 40 may be provided outside the main body 10. The controller 40 may control the operation of each element according to an instruction from an external host controller.

Figure 5A:
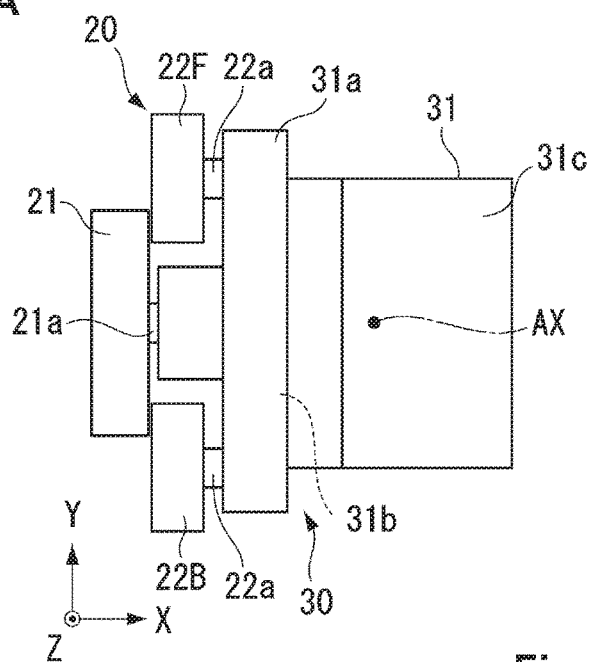
FIGS. 5A-5C are enlarged views showing a traveler and a coupler of the rail-guided trolley, FIG. 5A being a plan view, FIG. 5B being a front elevation view, and FIG. 5C being a side view.
Figure 5B:
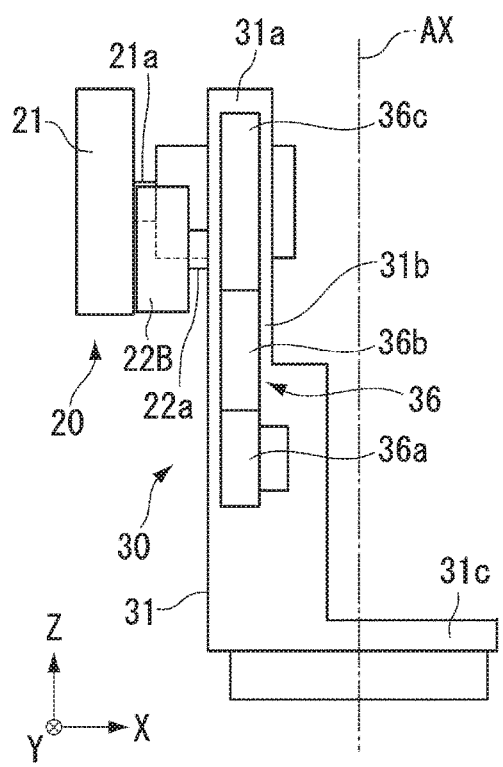
Figure 5C:
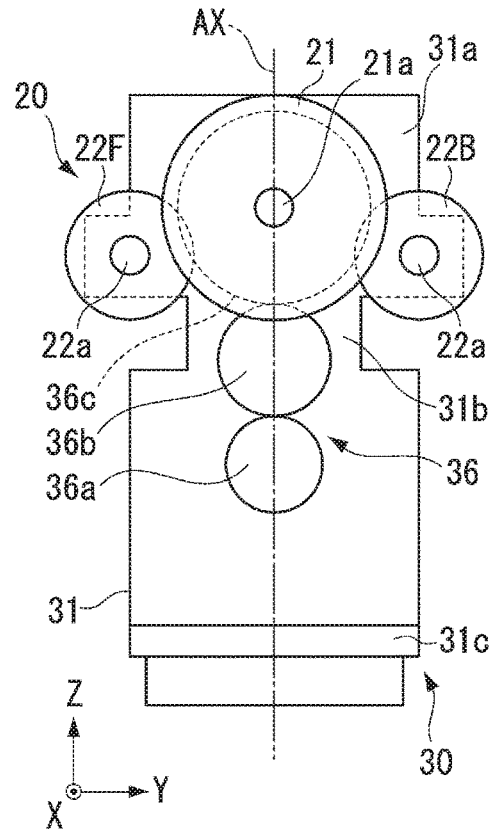

FIGS. 5A-5C are enlarged views showing the traveler 20 and the coupler 30, FIG. 5A being a plan view, FIG. 5B being a front elevation view, and FIG. 5C being a side view. As shown in FIGS. 5A-5C, the traveling wheel 21 of the traveler 20 is provided so as to be able to be rotated by the axis 21a that is parallel to the X direction (horizontal direction). The axis 21a is supported on the coupler 30. Each of the two auxiliary wheels 22 is provided so as to be able to be rotated by an axis 22a that is parallel to the X direction (horizontal direction). Each axis 22a is supported on the coupler 30. Each axis 22a is arranged parallel to the axis 21a of the traveling wheel 21. However, the arrangement is not limited to this, and the axis 21a and the axis 22a need not be parallel to each other.

The coupling member 31 provided in the coupler 30 includes a wheel supporter 31a, an intermediate portion 31b, and a main body coupler 31c. The wheel supporter 31a is located on a side of the rail R. The wheel supporter 31a rotatably supports the axis 21a of the traveling wheel 21 and the axis 22a of the auxiliary wheel 22. The intermediate portion 31b extends downward from the wheel supporter 31a and preferably has a thin plate shape having a thickness smaller than the length of the gap S of the rail R. This intermediate portion 31b allows the coupler 30 to pass through the gap S. The main body coupler 31c is located below the intermediate portion 31b and is located on the −Z side of the rail R. The main body coupler 31c is coupled to an upper surface (an end surface on the +Z side) of the main body 10.

The transmission 36 provided in the coupler 30 transmits the driving force generated by the drive source 35 (see FIG. 1). The transmission 36 includes a drive source side gear 36a, an intermediate gear 36b, and a traveling wheel side gear 36c. The drive source side gear 36a, the intermediate gear 36b, and the traveling wheel side gear 36c are arranged in a straight line along the vertical direction. However, the arrangement is not limited to this. The drive source side gear 36a is rotatable about a rotation axis that is parallel to the X direction. The drive source side gear 36a is connected to the output axis of the drive source 35 and meshes with the intermediate gear 36b.

The intermediate gear 36b is rotatable about a rotation axis that is parallel to the X direction, and meshes with the traveling wheel side gear 36c. The traveling wheel side gear 36c is connected to the axis 21a of the traveling wheel 21. Accordingly, as the output axis of the drive source 35 rotates, the rotational driving force is transmitted to the traveling wheel 21 at a predetermined reduction ratio via the drive source side gear 36a, the intermediate gear 36b, and the traveling wheel side gear 36c. Note that the transmission 36 is not limited to a configuration in which a plurality of gears are combined, and a configuration using a belt, a chain, or the like may be used.

Figure 6:
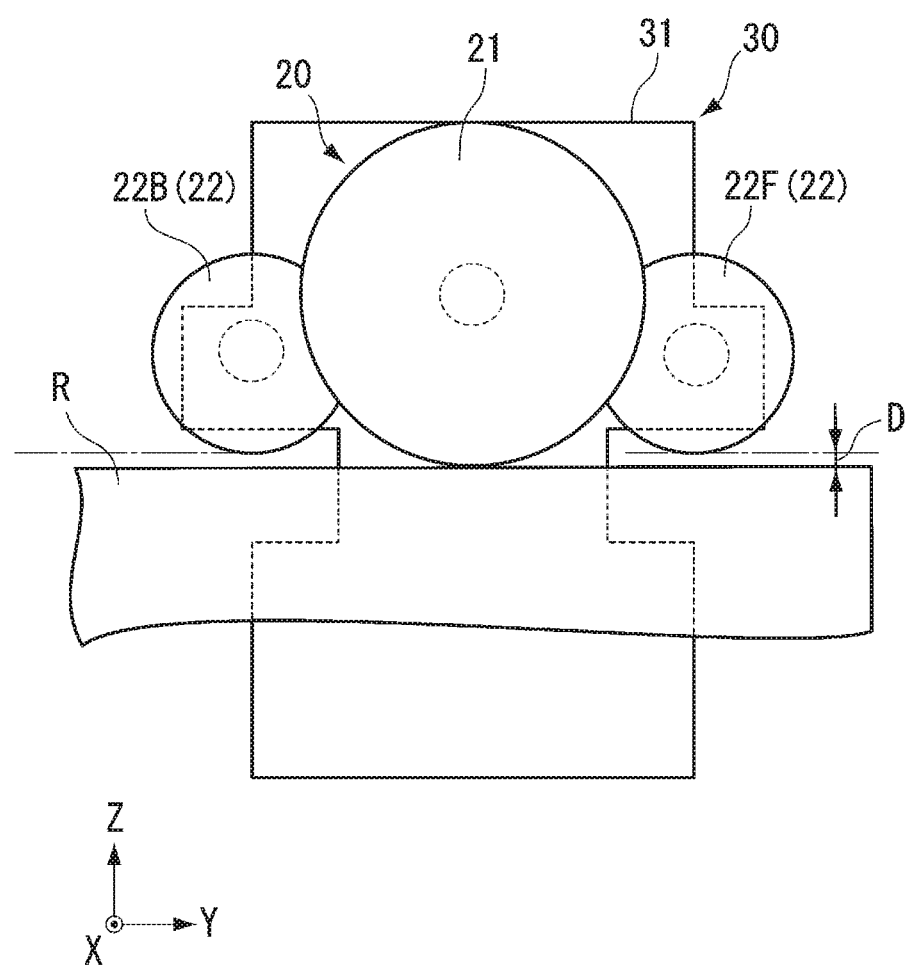
FIG. 6 is a diagram showing an example of contact heights of the traveling wheel and the auxiliary wheels with respect to the rail.

FIG. 6 is a diagram showing an example of contact heights of the traveling wheel 21 and the auxiliary wheels 22 with respect to the rail R. As shown in FIG. 6, the contact height of the auxiliary wheel 22 with respect to the rail R is higher than the contact height of the traveling wheel 21 with respect to the rail R. As a result, during normal traveling, the traveling wheel 21 comes in contact with the rail R, and each auxiliary wheel 22 at that time is in a state of having a space D in the Z direction with respect to the rail R. As a result, the auxiliary wheel 22 does not come in contact with the rail R except when the traveling wheel 21 is positioned on the gap S of the rail R. Therefore, unnecessary contact between the auxiliary wheel 22 and the rail R is prevented, and generation of particles is prevented. The size of the space D is set, for example, from about 100 μm to about 1 mm. However, the size of the space D may arbitrarily be set.

Moreover, the space D of the front side auxiliary wheel 22F and the space D of the rear side auxiliary wheel 22B preferably are set to the same size. In addition, the front side auxiliary wheel 22F and the rear side auxiliary wheel 22B preferably have the same diameter. As a result, in the case where the traveling wheel 21 enters the gap S, it is possible to prevent the coupler 30 from being tilted when the front side auxiliary wheel 22F and the rear side auxiliary wheel 22B come into contact with the rail R. Therefore, it is possible to prevent sway in the main body 10 when the traveler 20 passes through the gap S. Moreover, the friction coefficient of the auxiliary wheel 22 with respect to the rail R is smaller than that of the traveling wheel 21. As a result, when the traveler 20 pivots, the circumferential surface of the auxiliary wheel 22 moves on the rail R in a sliding manner, so that it is possible to easily change the traveling direction of the traveling wheel 21.

Figure 7A:
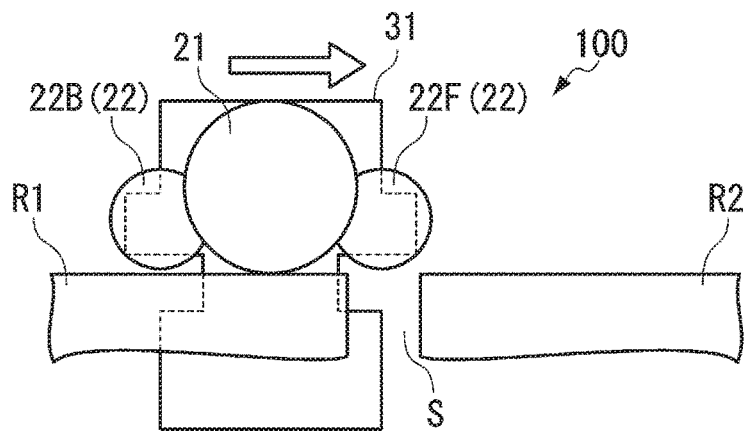
FIGS. 7A to 7C are side views showing an example of an operation of the traveling wheel and the auxiliary wheels traveling on the rail.
Figure 7B:
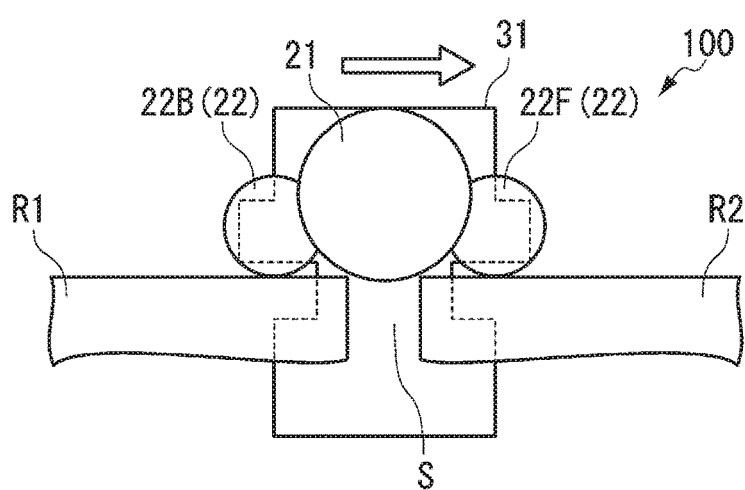
Figure 7C:
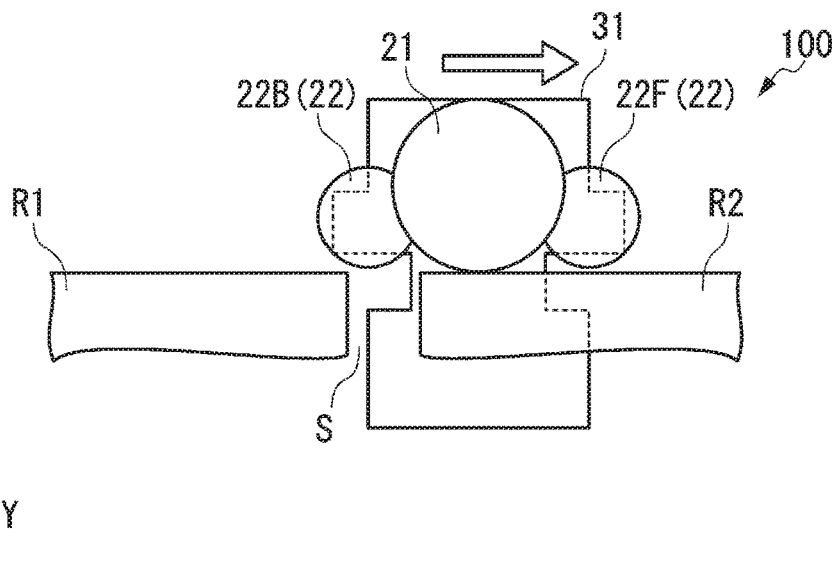

Next, an operation of the above rail-guided trolley system SYS will be described. FIGS. 7A to 7C are diagrams showing the operation in which the rail-guided trolley 100 moves across the linear portion R1 and the corner portion R2. When the rail-guided trolley 100 travels in the direction of the arrow from the linear portion R1 to the corner portion R2, as shown in FIG. 7A, the traveling wheel 21 is traveling on the linear portion R1 and is in contact with the linear portion R1. At this time, the front side auxiliary wheel 22F and the rear side auxiliary wheel 22B are separated upward from the linear portion R1 by the space D (see FIG. 6). In FIG. 7A, the front side auxiliary wheel 22F is approaching the gap S. However, since the traveling wheel 21 is in contact with the linear portion R1, the front side auxiliary wheel 22F is held above the gap S. Therefore, even when the front side auxiliary wheel 22F reaches the gap S, no vibration occurs to the main body 10.

Next, as shown in FIG. 7B, when the traveling wheel 21 approaches the gap S from the linear portion R1, the front side auxiliary wheel 22F is positioned on the corner portion R2 and the rear side auxiliary wheel 22B is positioned on the linear portion R1. Therefore, even if the traveling wheel 21 falls in the gap S, the front side auxiliary wheel 22F comes in contact with the corner portion R2 after descending by the space D and the rear side auxiliary wheel 22B comes in contact with the linear portion R1. Therefore, if the space D is small, the amount of descent of the traveling wheel 21 also is small. As a result, the amount of the traveling wheel 21 falling into the gap S is suppressed, so that the vertical movement of the traveling wheel 21 is reduced, and vibration given to the main body 10 (transportation container M) is prevented.

Next, as shown in FIG. 7C, when the traveling wheel 21 moves from the gap S to the corner portion R2, after the traveling wheel 21 runs upon the corner portion R2, the rear side auxiliary wheel 22B approaches the gap S from the linear portion R1. At this time, since it is sufficient for the traveling wheel 21 to ascend only by the space D by which it has descended previously, the amount of ascent of the traveling wheel 21 is also small. As a result, the amount of vertical movement made when the traveling wheel 21 exits the gap S becomes small and therefore, vibration given to the main body 10 (vibration given not only to the transportation container M but also to the content of the transportation container M) is prevented. Moreover, the rear side auxiliary wheel 22B is approaching the gap S. However, since the traveling wheel 21 is in contact with the corner portion R2, the rear side auxiliary wheel 22B is held above the gap S. Therefore, even when the rear side auxiliary wheel 22B reaches the gap S, no vibration occurs to the main body 10.

As described above, even when the traveling wheel 21 passes through the gap S, vibration applied to the main body 10 is able to be reduced or prevented by reducing the vertical movement of the traveling wheel 21 to prevent damage to the transportation container M or to the content of the transportation container M.

Figure 8A:
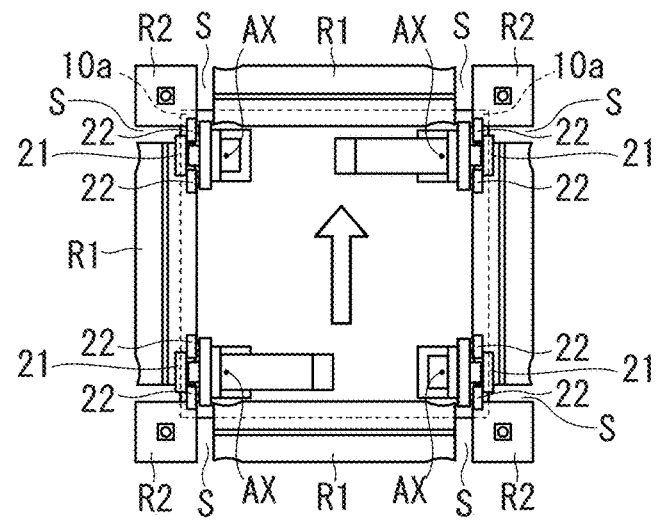
FIGS. 8A to 8C are side views showing an example of an operation of the traveling wheel and the auxiliary wheels changing the traveling direction thereof.
Figure 8B:
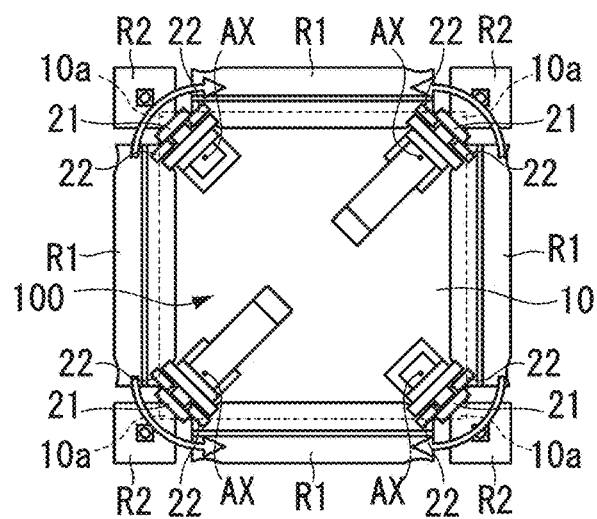
Figure 8C:
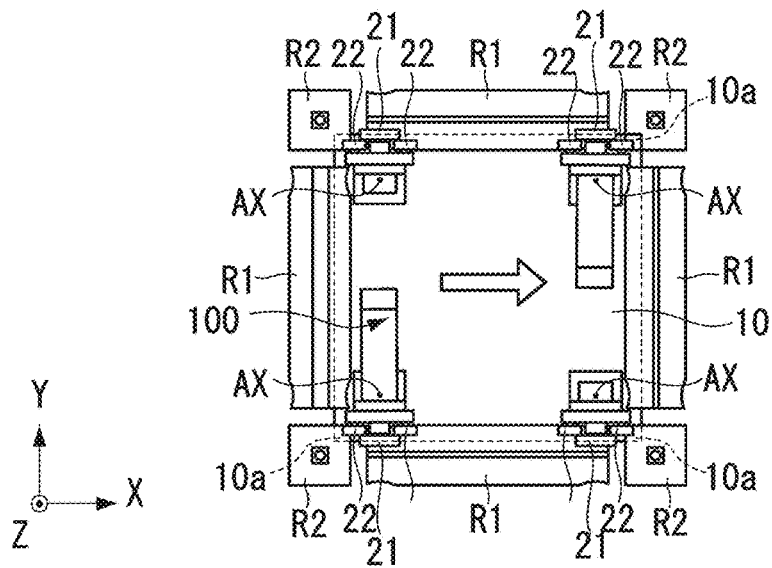

Next, a case where the rail-guided trolley 100 changes the traveling direction will be described. FIGS. 8A to 8C are diagrams showing an operation of changing the traveling direction of the rail-guided trolley 100 from the +Y direction to the +X direction. As shown in FIG. 8A, the rail-guided trolley 100 travels in the +Y direction and stops at a position where the main body 10 reaches an area within one cell of the rails R (at a position where the four corner portions 10a approach the corner portions R2). That is to say, the controller 40 (see FIG. 1 and FIG. 2) stops driving the traveling driver 32 at the above position based on position information from the position detector 33. At this time, the four traveling wheels 21 are all in contact with the linear portions R1.

Next, as shown in FIG. 8B, the controller 40 drives the pivot driver 34 to cause the coupler 30 to pivot, and causes the traveling wheel 21 and the auxiliary wheels 22 positioned at the four corner portions 10a to pivot in the in the OZ direction about the pivot axis AX respectively. At this time, the traveling wheels 21 and so forth positioned diagonally opposed to each other pivot in the same direction. For example, among the four traveling wheels 21, in the figure, the traveling wheel 21 and so forth at the upper left and the traveling wheel 21 and so forth at the lower right pivot in the clockwise direction. On the other hand, in the figure, the traveling wheel 21 and so forth at the upper right and the traveling wheel 21 and so forth at the lower left pivot in the counter-clockwise direction. Such a pivoting operation may be performed at the same timing or may be performed at different timings. That is to say, for example, the traveling wheels 21 and so forth at the upper left and lower right in the figure may be pivoted at the same time, and then the traveling wheels 21 and so forth at the upper right and lower left may be pivoted at the same time.

Next, as shown in FIG. 8C, after each traveling wheel 21 and so forth have pivoted 90° in the OZ direction, the controller 40 stops driving of the pivot driver 34. By driving the traveling driver 32 in this state, the rail-guided trolley 100 can travel in the +X direction. The rail-guided trolley 100 can also travel in the −X direction. Note that the main body 10 does not pivot even when the traveling wheels 21 and so forth pivot. Therefore, in both the case where the rail-guided trolley 100 travels in the Y direction and the case where the rail-guided trolley 100 travels in the X direction, the orientation of the main body 10 stays unchanged.

Figure 9A:
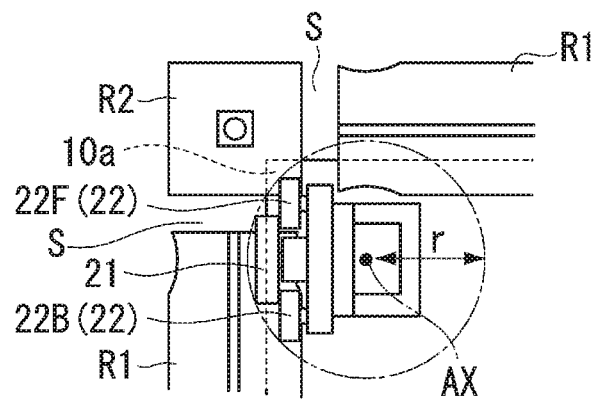
FIGS. 9A to 9D are enlarged plan views showing the traveling wheel and the auxiliary wheels when the traveling direction is changed.

FIGS. 9A to 9D are enlarged plan views showing an operation of the traveling wheel 21 and the auxiliary wheels 22 when the traveling direction of the rail-guided trolley 100 is changed. As shown in FIG. 9A, at the position where the main body 10 reaches an area within one cell of the rails R, the front side auxiliary wheel 22F is positioned above the gap S, and the traveling wheel 21 and the rear side auxiliary wheel 22B are positioned on the linear portion R1. In this case, the traveling wheel 21 comes in contact with the linear portion R1, and neither the front side auxiliary wheel 22F nor the rear side auxiliary wheel 22B comes in contact with the linear portion R1 or the corner portion R2.

Figure 9B:
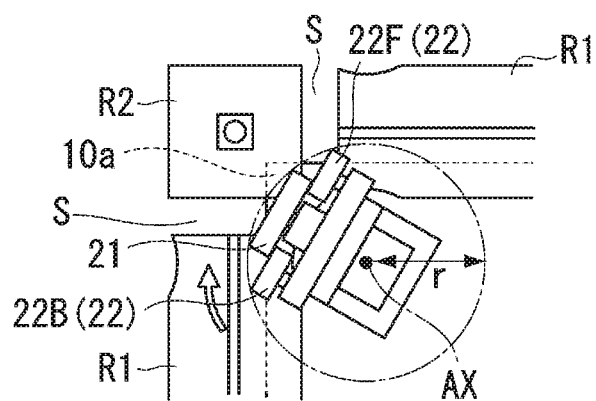

FIG. 9B shows a state in which the traveling wheel 21 and the auxiliary wheels 22 have pivoted approximately 300 in the clockwise direction about the pivot axis AX from the state shown in FIG. 9A. In this case, although the traveling wheel 21 is positioned in the gap S and descends, the front side auxiliary wheel 22F approaches and comes in contact with the linear portion R1 in the X direction of the pivoting destination and the rear side auxiliary wheel 22B comes in contact with the linear portion R1. Therefore, the amount of descent of the traveling wheel 21 is able to be small, and vibration applied to the main body 10 (transportation container M) is able to be reduced.

Figure 9C:
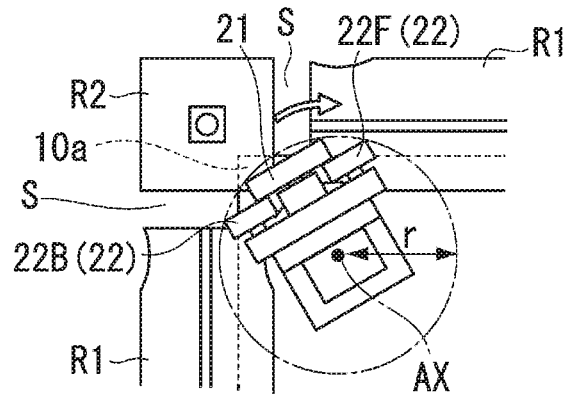

FIG. 9C shows a state in which the traveling wheel 21 and the auxiliary wheels 22 have further pivoted approximately 30° in the clockwise direction from the state shown in FIG. 9B. After having run upon the corner portion R2, the traveling wheel 21 is positioned again on the gap S and descends. In this case, the front side auxiliary wheel 22F comes in contact with the linear portion R1 in the X direction and the rear side auxiliary wheel 22B comes in contact with the linear portion R1 in the Y direction before reaching the gap S. Therefore, the amount of descent of the traveling wheel 21 caused by the gap S becomes small, and vibration applied to the main body 10 (transportation container M) is able to be reduced.

Figure 9D:
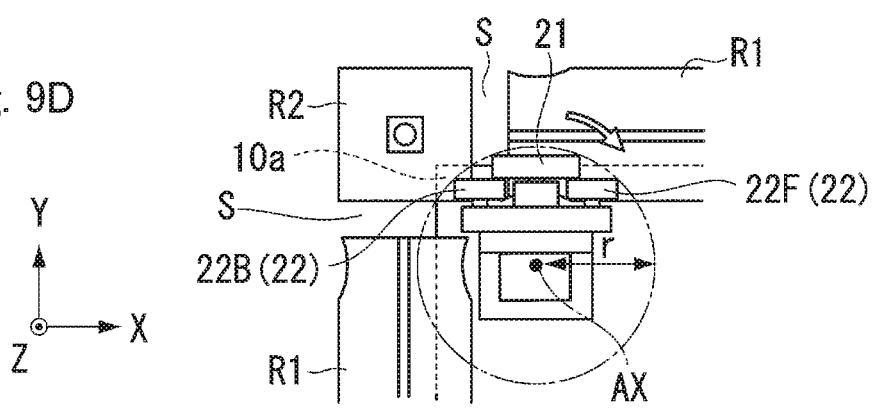

FIG. 9D shows a state in which the traveling wheel 21 and the auxiliary wheels 22 have further pivoted approximately 30° in the clockwise direction from the state shown in FIG. 9C. In this case, the traveling wheel 21 and the front side auxiliary wheel 22F are positioned on the linear portion R1 in the X direction and the rear side auxiliary wheel 22B is positioned above the gap S. In this case, the traveling wheel 21 comes in contact with the linear portion R1, and neither the front side auxiliary wheel 22F nor the rear side auxiliary wheel 22B comes in contact with the linear portion R1 or the corner portion R2.

As described above, in the case where the traveling wheel 21 and the auxiliary wheels 22 are pivoted, even when the traveling wheel 21 passes through the gap S, it is possible to reduce the vertical movement of the traveling wheel 21. As a result, it is possible to reduce or prevent vibration applied to the main body (transport container M) and to prevent damage to the transportation container M or to the content of the transportation container M. In addition, the auxiliary wheel 22 is located on the inner side of the traveling wheel 21. As a result, the maximum pivoting radius (rotation radius) r of the traveling wheel 21 and the auxiliary wheels 22 coincides with the pivoting trajectory radius (rotation radius) of the traveling wheel 21. Therefore, the rotation radius is reduced to be small even when the two auxiliary wheels 22 are provided, and the space required for changing the traveling direction of the rail-guided trolley 100 is able to be small.

Furthermore, the auxiliary wheels 22 (the front side auxiliary wheel 22F and the rear side auxiliary wheel 22B) move in a direction deviated from the rotation direction at the time of pivoting. However, the friction coefficient of the auxiliary wheels 22 with respect to the rail R is smaller than that of the traveling wheel 21, and therefore, the auxiliary wheels 22 can move on the rail R smoothly. Therefore, the movement of the auxiliary wheels 22 is smooth and the direction of the traveling wheel 21 is able to be changed easily.

Figure 10A:
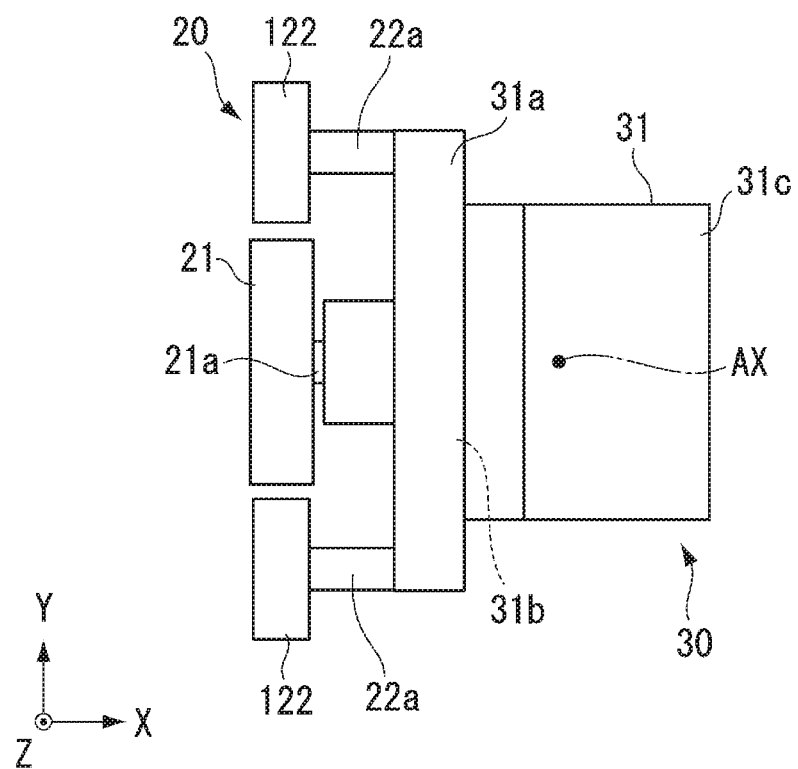
FIGS. 10A and 10B are plan views showing another example of the traveler and the coupler of the rail-guided trolley.
Figure 10B:
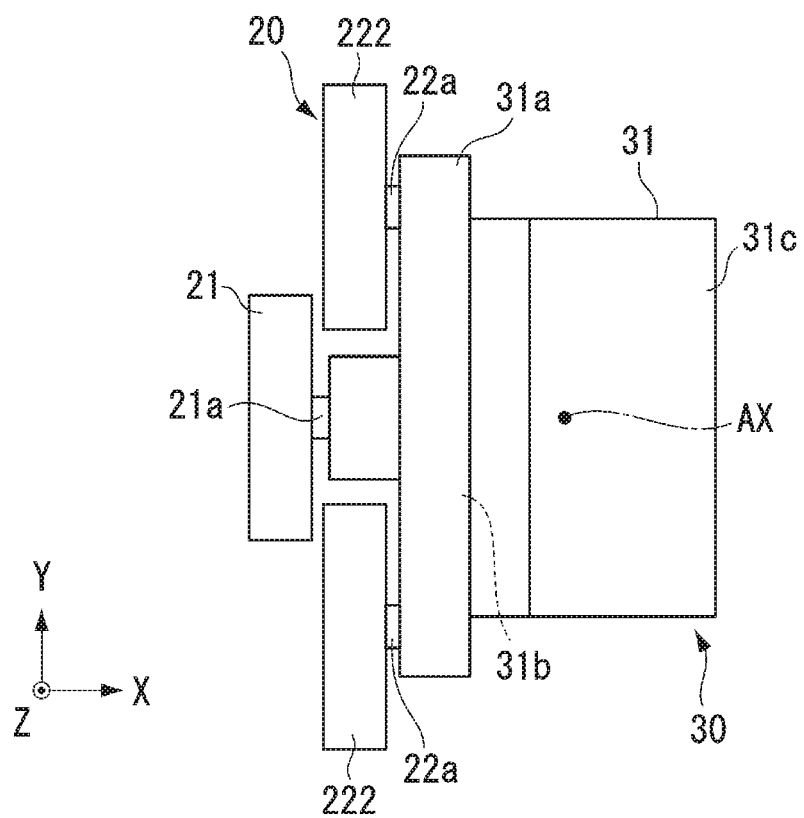

Moreover, the auxiliary wheel 22 is not limited to the above mode. FIGS. 10A and 10B are plan views showing another example of the traveler 20 and the coupler 30 of the rail-guided trolley 100. In the following description, the same or similar members as or to those in the above preferred embodiments are assigned with the same symbols and the descriptions thereof are omitted or simplified. In the example shown in FIG. 10A, the auxiliary wheels 122 are linearly arranged in the traveling direction (Y direction) with respect to the traveling wheel 21. These auxiliary wheels 122 are each rotatably supported on a long axis 22a along the X direction.

According to this example, since the traveling wheel 21 and the auxiliary wheels 122 are arranged linearly, the width of the rail R is able to be narrowed. As with the auxiliary wheel 22 shown in FIG. 6, the auxiliary wheel 122 is located so that the contact height of the auxiliary wheel 22 with respect to the rail R is higher than the contact height of the traveling wheel 21 with respect to the rail R. Also, either the front side auxiliary wheel 122 or the rear side auxiliary wheel 122 may be aligned in the traveling direction with respect to the traveling wheel 21, and the other one may be located on the inner side of the traveling wheel 21.

In the example shown in FIG. 10B, the diameter of the auxiliary wheel 222 is the same as or substantially equal to the diameter of the traveling wheel 21. According to this configuration, the same components as those of the traveling wheel 21 can be used for the auxiliary wheels 222, and it is possible to save the trouble of fabricating small auxiliary wheels. As with the auxiliary wheel 22 shown in FIG. 6, the auxiliary wheel 222 is located so that the contact height of the auxiliary wheel 22 with respect to the rail R is higher than the contact height of the traveling wheel 21 with respect to the rail R. Moreover, the auxiliary wheel 222 may be located on either the front side or the rear side of the traveling wheel 21, and an auxiliary wheel 22 of a smaller diameter may be located on the other side.

The preferred embodiments of the present invention have been described above. However, the present invention is not limited to the above description and various modifications may be made without departing from the gist of the present invention. For example, in the above preferred embodiments, the configuration in which the auxiliary wheels 22 rotate has been described as an example, but the present invention is not limited thereto. For example, the auxiliary wheels 22 may slide without rotating. Moreover, the friction coefficient of the auxiliary wheel 22 with respect to the rail R is not limited to being smaller than that of the traveling wheel 21, and the friction coefficient of the auxiliary wheel 22 may be the same as that of the traveling wheel 21.

In the above preferred embodiments, the contact height of the auxiliary wheel 22 with respect to the rail R has been described as being higher than that of the traveling wheel 21. However, the contact height of the auxiliary wheel 22 with respect to the rail R is not limited to being higher than the contact height of the traveling wheel 21, and the contact height of the auxiliary wheel 22 may be the same as that of the traveling wheel 21. That is to say, the space D may be zero. Also, only one of the front side auxiliary wheel 22F and the rear side auxiliary wheel 22B may have a higher contact height with respect to the rail R than the that of the traveling wheel 21.

In the above preferred embodiments, the two traveling wheels 21 in diagonally opposed positions among those in the four corners 10a of the main body 10 are described as driving wheels, but the present invention is not limited thereto. For example, three or all of the traveling wheels 21 may define and function as driving wheels, or only one traveling wheel 21 may define and function as a driving wheel. Also, the drive source 35 is not limited to being provided for each of the two traveling wheels 21 that define and function as the driving wheels. For example, the driving force may be transmitted from a single drive source 35 to the two traveling wheels 21. This enables a reduction in the number of the drive sources 35 to be installed.

In the above preferred embodiments, the configuration in which the main body 10 fits in one cell of the grid pattern of the rails R in a plan view has been described as an example, but the present invention is not limited thereto. For example, the main body 10 may be of a size greater than that of one cell of the rails R in a plan view, or may be of a shape in which a portion thereof protrudes from one cell of the rails R. In addition, the contents of Japanese Patent Application No. 2016-165607 and all documents cited in the detailed description of the present invention are hereby incorporated herein by reference in their entirety.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A rail-guided trolley system comprising:
a main body that, along rails including a portion thereof arranged in a grid pattern, holds and transports an article on a lower side of the rails;
a traveling wheel that is provided at each of four corners of the main body and that travels on the rails;
a controller that controls a pivot driver that changes an orientation of the traveling wheel; and
an auxiliary wheel that is located at least in either front or rear in a traveling direction of the traveling wheel; wherein
a contact height of the auxiliary wheel with respect to the rails is higher than a contact height of the traveling wheel with respect to the rails.

2. The rail-guided trolley system according to claim 1, wherein the main body fits within a cell of the grid pattern of the rails in a plan view.

3. The rail-guided trolley system according to claim 1, wherein at least one of the four traveling wheels is a driving wheel.

4. The rail-guided trolley system according to claim 3, wherein two of the four traveling wheels arranged in diagonally opposed positions in the main body are drive wheels.

5. The rail-guided trolley system according to claim 1, wherein the auxiliary wheel is located on an inner side of the traveling wheel.

6. The rail-guided trolley system according to claim 1, wherein the auxiliary wheel is smaller in diameter than the traveling wheel.

7. The rail-guided trolley system according to claim 1, wherein the auxiliary wheel has a smaller friction coefficient with respect to the rails than that of the traveling wheel.

8. A rail-guided trolley comprising:
a main body that, along rails including a portion thereof arranged in a grid pattern, holds and transports an article on a lower side of the rails;
a traveling wheel that is provided at each of four corners of the main body and that travels on the rails;
a pivot driver that changes an orientation of the traveling wheel; and
an auxiliary wheel that is located at least in either front or rear in a traveling direction of the traveling wheel; wherein
a contact height of the auxiliary wheel with respect to the rails is higher than a contact height of the traveling wheel with respect to the rails.

* * * * *